United States Patent
Singh (10) Patent No.: US 10,250,211 B1
(45) Date of Patent: Apr. 2, 2019

(54) BETA EQUALIZATION TO REDUCE NON-LINEAR DISTORTIONS OF BIPOLAR TRANSISTOR AMPLIFIERS

(71) Applicant: TEXAS INSTRUMENTS INCORPORATED, Dallas, TX (US)

(72) Inventor: Ravpreet Singh, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/807,927

(22) Filed: Nov. 9, 2017

(51) Int. Cl.
*H03F 3/26* (2006.01)
*H03G 3/30* (2006.01)
*H03F 1/26* (2006.01)
*H03F 3/04* (2006.01)
*H03F 1/02* (2006.01)

(52) U.S. Cl.
CPC ............ *H03G 3/30* (2013.01); *H03F 1/0211* (2013.01); *H03F 1/26* (2013.01); *H03F 3/04* (2013.01); *H03F 2200/372* (2013.01)

(58) Field of Classification Search
CPC ..................................... H03F 3/26; H03F 3/30
USPC .......................................... 330/255, 267, 268
See application file for complete search history.

(56) References Cited

U.S. PATENT DOCUMENTS 4,779,057 A * 10/1988 Woo ........................ H03F 1/22
330/149
6,285,256 B1 * 9/2001 Wong .................... H03F 3/3028
330/255

* cited by examiner

*Primary Examiner* — Steven J Mottola
(74) *Attorney, Agent, or Firm* — John R. Pessetto; Charles A. Brill; Frank D. Cimino (57) ABSTRACT

Reducing non-linear distortions of an electronic device by performing at least the following: receiving, at an output stage circuit of an amplifier, an input signal from a previous stage circuit of the amplifier, driving a first subset of output transistors within the output stage circuit with an auxiliary buffer circuit to generate a first half cycle of an output signal Vout, driving a second subset of output transistors within the output stage circuit with the input signal to generate the first half cycle of the output signal Vout, and driving a set of output transistors with the input signal to generate a second half cycle of the output signal Vout, wherein the auxiliary buffer circuit equalizes the overall current gain associated with the first and second subset of output transistors with the overall current gain associated with the set of output transistors.

20 Claims, 4 Drawing Sheets

BETA EQUALIZATION TO REDUCE NON-LINEAR DISTORTIONS OF BIPOLAR TRANSISTOR AMPLIFIERS

BACKGROUND

Output signals from amplifiers generally include desired electrical signals and undesired electrical signals that negatively impact device performance. Examples of undesired electrical signals include noise generated internal and/or external to an amplifier and distortions that occur based on the amplifier's non-linear behavior. For instance, many high-speed operational amplifiers utilize bipolar transistors as one of its building blocks to amplify an input signal. However, bipolar transistors typically have characteristics, such as junction capacitances, current gain, collector current, collector-to-emitter voltage, and transconductance that exhibit non-linear transfer functions. As a result, when operating bipolar transistors, such as when driven into saturation or cut-off, the bipolar transistors can exhibit non-linear behavior that causes distortions in an amplifier's output signal.

Distortions that originate from an amplifier's non-linear behavior can include even-order non-linear distortions (e.g., second-order non-linear distortions). As an example, if an amplifier has an exponential transfer function of $y=e^x$, where x is the input signal and y is the output signal, then the exponential transfer function can be expanded into a power series based on equation 1 shown below.

$$e^x = 1 + x + x^2/2 + x^3/6 + x^4/24 + x^5/120 + \ldots + x^n/n! \quad (1)$$

As an input signal progressively moves farther away from zero and becomes larger (e.g., no longer a relatively small input signal), the second-order distortion term ($x^2/2$), the third-order distortion term ($x^3/3$), and other higher-order distortion terms increasingly affect the output signal and cause non-linear amplification. Often times, the output stage circuit of an amplifier contributes to these even-order non-linear distortions, in particular, at the low and mid frequency regions. One option in equalizing and reversing these even-order nonlinear distortions is to increase the amplifier's gain bandwidth product (GBP). Unfortunately, increasing the GBP for amplifiers can be power intensive, which can be impractical in low-power environments and designs. As such, being able to equalize nonlinearity distortions without significantly increasing power consumption within amplifiers, such as operational amplifiers, remains valuable in improving device performance.

SUMMARY

The following presents a simplified summary of the disclosed subject matter in order to provide a basic understanding of some aspects of the subject matter disclosed herein. This summary is not an exhaustive overview of the technology disclosed herein. It is not intended to identify key or critical elements of the invention or to delineate the scope of the invention. Its sole purpose is to present some concepts in a simplified form as a prelude to the more detailed description that is discussed later.

In one embodiment, an output stage circuit comprising: a first set of output transistors configured to couple to a load of the amplifier and produce a portion of an output signal Vout of the output stage circuit, a second set of output transistors configured to couple the load of the amplifier and produce another portion of the output signal Vout, an auxiliary buffer circuit directly connected to base nodes of a first subset of the first set of output transistors, and a bias circuit coupled to base nodes of a second subset of the first set of output transistors, base nodes of the second set of output transistors, and the auxiliary buffer circuit, wherein the base nodes of second subset and the base nodes of the second set of output transistors are coupled to one or more input terminals that provide an input signal from a previous stage circuit of the output stage circuit.

In another embodiment, an output stage circuit of an amplifier comprising: a first set of output transistors configured to couple to a load of the amplifier and produce a portion of an output signal Vout of the output stage circuit, a second set of output transistors configured to couple the load of the amplifier and produce another portion of the output signal Vout, an auxiliary buffer circuit directly connected to a first subset of the first set of output transistors, wherein the auxiliary buffer circuit is configured to drive base nodes for the first subset the first set of output transistors to equalize the current gain of the first set of output transistors with the second set of output transistors, and wherein a second subset of the first set of output transistors are driven by an input signal from a previous stage circuit of the output stage circuit.

In yet another embodiment, a method comprising: receiving, at an output stage circuit of an amplifier, an input signal from a previous stage circuit of the amplifier, driving a first subset of output transistors within the output stage circuit with an auxiliary buffer circuit that receives the input signal to generate a first half cycle of an output signal Vout, driving a second subset of output transistors within the output stage circuit with the input signal to generate the first half cycle of the output signal Vout, and driving a set of output transistors with the input signal to generate a second half cycle of the output signal Vout, wherein the auxiliary buffer circuit equalizes an overall current gain associated with the first and second subset of output transistors with an overall current gain associated with the set of output transistors.

BRIEF DESCRIPTION OF THE DRAWINGS

For a detailed description of various examples, reference will now be made to the accompanying drawings in which.

While certain embodiments will be described in connection with the illustrative embodiments shown herein, the invention is not limited to those embodiments. On the contrary, all alternatives, modifications, and equivalents are included within the spirit and scope of the invention as defined by the claims. In the drawing figures, which are not to scale, the same reference numerals are used throughout the description and in the drawing figures for components and elements having the same structure, and primed reference numerals are used for components and elements having a similar function and construction to those components and elements having the same unprimed reference numerals.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors. The terms "a," "an," and "the" are not intended to refer to a singular entity unless explicitly so defined, but include the general class of which a specific example may be used for illustration. The use of the terms "a" or "an" may therefore mean any number that is at least one, including "one," "one or more," "at least one," and "one or more than one." The term "or" means any of the alternatives and any combination of the alternatives, including all of the alternatives, unless the alternatives are explicitly indicated as mutually exclusive. The phrase "at least one of" when combined with a list of items, means a single item from the list or any combination of items in the list. The phrase does not require all of the listed items unless explicitly so defined.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

Various example embodiments are disclosed herein that equalize non-linear distortions in an electronic device that generates an amplified output signal from one or more input signals. The electronic device (e.g., an operational amplifier) contains an output stage circuit with an auxiliary buffer circuit that equalizes non-linear distortions caused from unsymmetrical positive and negative half cycles used to form the electronic device's output signal Vout. To generate the output signal Vout, the output stage circuit contains a first set of output transistors that drives the positive half cycle (e.g., +Ve half cycle) of the output signal Vout and a second set of output transistors that drives the negative half cycle (e.g., −Ve half cycle) of the output signal Vout. To ensure the current-gain, which can also be referred to as a beta ($\beta$) value within this disclosure, of the first set of output transistors matches the current-gain of the second set of output transistors, the auxiliary buffer circuit drives in parallel one or more of the output transistors either in the first set of output transistors or second set of output transistors. By doing so, the auxiliary buffer corrects even-order non-linear distortions by matching the current-gain associated with the positive half cycle to the current-gain associated with the negative half cycle of the output signal Vout. In one embodiment, the auxiliary buffer is a five pack differential to single-ended stage amplifier that self-compensates and consumes a relatively small amount of current when compared to the electronic device.

Figure 1:
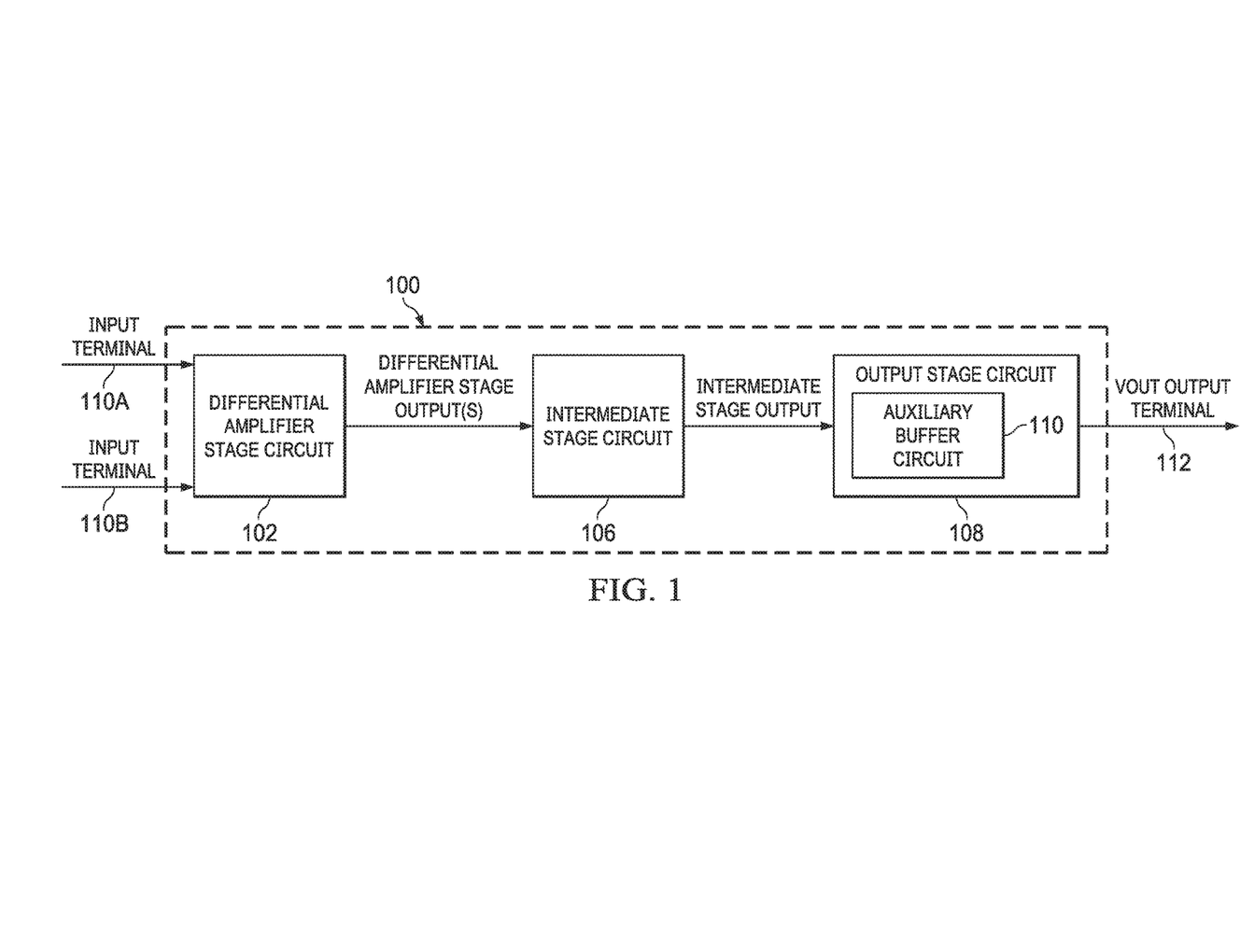
FIG. 1 is a block diagram of an electronic device in accordance with various embodiments.

FIG. 1 is a block diagram of an electronic device 100 in accordance with various embodiments. As an example, the electronic device 100 could be an operational amplifier, where input terminal 110A represents a non-inverted input terminal and input terminal 110B represents an inverted input terminal 110B. Alternatively, the input terminal 110A could represent an inverted input terminal and input terminal 110B could represent a non-inverted input terminal. As an operational amplifier, the electronic device 100 is configured to compare two voltages and/or currents received at the input terminal 110A and 110B and generate an output signal Vout (e.g., an analog output) at the output terminal 112. The electronic device 100 generates the output signal Vout based on the comparison between the two input terminals. For example, the electronic device 100 may generate an output signal that represents a binary output corresponding to a value of zero or one depending on the voltages and/or currents at input terminals 110A and 110B.

As shown in FIG. 1, the electronic device 100 includes a differential amplifier stage circuit 102, an intermediate stage circuit 106, and an output stage circuit 108. The differential amplifier stage circuit 102 receives input voltages at the two different input terminals 110A and 110B of the electronic device 100. When the differential amplifier stage circuit 102 receives the input voltages at input terminal 110A and 110B, voltage differences at the input terminals 110A and 110B cause a rise in differential currents within the differential amplifier stage circuit 102. The differential amplifier stage circuit 102 applies the rise in the differential currents to produce one or more differential amplifier stage outputs (e.g., a single-ended output and/or differential outputs). Electronic device 100 could utilize a variety of differential amplifier circuit designs well-known in the art to account for variety of design considerations that include, but are not limited to, balancing processing speed and power tradeoffs, improving input impedance and/or gain, reducing noise and/or device size, and/or minimizing process imperfections.

FIG. 1 illustrates that the differential amplifier stage outputs are forwarded to drive the intermediate stage circuit 106. The intermediate stage circuit 106 receives the differential amplifier stage outputs and generates an intermediate stage output to supply the output stage circuit 108. The intermediate stage circuit 106 may act as a voltage amplification stage that increases the voltage gain of the differential amplifier stage outputs. In embodiments where the differential amplifier stage circuit 102 produces multiple output signals, the intermediate stage circuit 106 contains another differential amplifier type circuit that converts the multiple differential amplifier stage outputs to a single-ended output. Additionally, the intermediate stage circuit 106 may utilize a level shifter circuit that prevents a direct current (DC) offset for the electronic device's output signals. Similar to the differential amplifier stage circuit 102, the electronic device 100 could utilize a variety of intermediate stage circuit designs that are well-known in the art to account for a variety of design considerations.

The output stage circuit 108 receives the intermediate stage output and produces an output signal Vout on the output terminal 112. The output stage circuit 108 is configured to supply adequate current to a load without dissipating too much power in output transistors in the output stage circuit 108 and provide a relatively low output impedance to allow coupling of a low impedance load without loss of gain.

Examples of output stage circuit 108 that generates a suitable output signal Vout can be a class AB output stage circuit. As shown in FIG. 1, the output stage circuit 108 incorporates an auxiliary buffer circuit 114 to equalize non-linear distortions caused from the output signal Vout having unsymmetrical positive and negative half cycles. In one embodiment, the auxiliary buffer circuit 114 is connected to one or more output transistors that drive the positive half cycle of the output signal Vout. By driving the output transistors, the auxiliary buffer circuit 114 is able to match the overall β value for the output transistors that drive the positive half cycle with the overall β value of the output transistors that drive the negative half cycle of the output signal Vout. In another embodiment, the auxiliary buffer circuit 114 may be coupled to the output transistors that drive the negative half cycle of the output signal. The number of output transistors the auxiliary buffer circuit 114 directly drives is based on the differences between the overall β value for the positive half cycle and negative half cycle. Non-limiting examples of the output stage circuit 108 and auxiliary buffer circuit 114 are discussed in more detail in relation to FIGS. 2-5.

Circuit designers may design and fabricate circuits 102, 106, 108, and 114 within the electronic device 100 using a variety of semiconductor technologies. For example, circuit designers may design the circuits 102, 106, 108, and 114 utilizing bipolar complementary metal-oxide-semiconductor (BiCMOS) technology that combines bipolar junction transistors and complementary metal-oxide-semiconductor (CMOS) transistors into an integrated circuit. Combining bipolar junction and CMOS transistors into an integrated circuit allows circuit designers to employ advantages that bipolar junction transistors may have over CMOS transistors and vice versa. For instance, bipolar junction transistors may be able to realize higher voltage gains, perform better at high-frequencies, and have relatively lower output resistance. CMOS transistors, on the other hand, may be able to achieve higher input resistances and relatively lower input bias current, and may be better at implementing low-power logic gates.

The fabrication processes for circuits 102, 106, 108, and 114 generally provide control of transistor characteristics for a specific range of values rather than providing precise values. To account for fabrication process variations, circuit designers are able to utilize slow, nominal, and fast process corners to characterize the fabrication process distributions when designing circuits 102, 106, 108, and 114. A nominal processor corner corresponds to the center of the fabrication process distribution (e.g., a Gaussian distribution) while the slow and fast process corners correspond to different extremes of a fabrication process distribution. The slow process corner represents the worst operating condition (e.g., slower operation speeds) for circuits 102, 106, 108, and 114 caused from excessive process variations, and fast process corners represents faster operating conditions than specified. In one embodiment, the auxiliary buffer circuit 114 for matching of the overall β values of the output transistors may relate to a specific process corner, for example, the nominal process corner. Specifically, the auxiliary buffer circuit 114 may not change the distortion variation with respect to the process corners, but rather may center the variation to improve linearity performance of the output stage circuit 108 for a particular process corner.

Although FIG. 1 illustrates a specific embodiment of an electronic device 100 generates an amplified output signal based on multiple input signals, the disclosure is not limited to the specific embodiment illustrated in FIG. 1. For instance, although FIG. 1 illustrates that the electronic device 100 is a multi-stage amplifier, the electronic device 100 could be implemented with less or more stages shown FIG. 1. The electronic device 100 could also include other components not explicitly shown in FIG. 1 that are known by persons of ordinary skill in the art and typically found in amplifier devices. Additionally, other embodiments of the electronic device 100 may combine one or more components into a single component and/or utilize a different number of input terminals 110. For instance, rather than utilizing two input terminals 110, other embodiments of the electronic device 100 may include a single input terminal 110, where the electronic device 100 amplifies the difference between the voltage at the single input and a ground reference. The use and discussion of FIG. 1 is only an example to facilitate ease of description and explanation.

Figure 2:
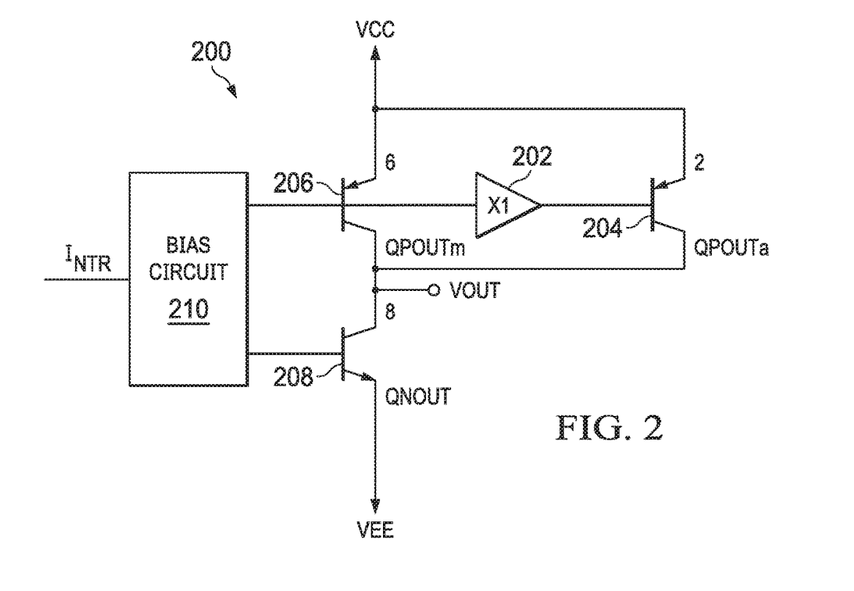
FIG. 2 is a schematic diagram of an embodiment of an output stage circuit that includes an auxiliary buffer circuit to drive a positive half cycle of output signal Vout.

FIG. 2 is a schematic diagram of an embodiment of an output stage circuit 200 that includes an auxiliary buffer circuit 202 to drive the positive half cycle of output signal Vout. Using FIG. 1 as an example, the output stage circuit 200 can be part of and/or correspond to the output stage circuit 108 shown in FIG. 1. FIG. 2 depicts that the output stage circuit 200 is a class AB output stage circuit that includes a bias circuit 210 for biasing the current and/or voltage at the base nodes of the output transistors 204, 206 and 208 at a relatively small, nonzero current. The bias circuit 210 also connects with auxiliary buffer circuit 202, which then connects to the output transistors 204. In FIG. 2, the output transistors 204 and 206 are p-type emitter, n-type base, and a p-type collector (PNP) bipolar junction transistors, and the output transistors 208 are n-type emitter, p-type base, and n-type collector (NPN) bipolar junction transistors. FIG. 2 illustrates that the output stage circuit 200 includes eight output transistors 208, six output transistors 206, and two output transistors 204 positioned in parallel to drive the output signal Vout. Other embodiments of output stage circuit 200 may utilize a different number of output transistors 204, 206, 208. As an example, the output stage circuit 200 could include two output transistors 204, four output transistors 206, and six output transistors 208 to drive the output signal Vout.

The output signal Vout may be based on a transfer function characteristic that generates a negative output voltage (e.g., −Ve) or pulls current from an output load when the output transistors 208 are turned ON and a positive output voltage (e.g., +Ve) or pushes current into the output load when output transistors 204 and 206 are turned ON. The output stage circuit 200 activates either output transistors 208 or output transistors 204 and 206 depending on the input current $I_{NTR}$. Within this disclosure, the positive half cycle refers to when the transfer function characteristic produces a positive output signal Vout (e.g., output transistors 204 and 206 are pushing current) and a negative half cycle refers to when the transfer function characteristic produces a negative output signal Vout (e.g., output transistors 208 are pulling current). Biasing the base nodes for output transistors 204, 206 and 208 reduces the amount of crossover distortion as the output signal Vout transitions between its positive and negative half cycles. The bias circuit 210 may be implemented using any bias circuit configurations well-known in the art based on variety of design considerations that include, but are not limited to, the desired quiescent current, amount of power dissipation, and temperature effects.

For relatively small signal operations, the transfer function of the output stage circuit 200 can be approximately defined as shown in equation 2.

$$V_{OUT}=I_{NTR}*R_\pi*G_{MOUT}*R_L \quad (2)$$

In equation 2 shown above, $I_{NTR}$ represents the current output from the previous stage (e.g., the intermediate stage circuit 106 using FIG. 1 as an example); $R_L$ represents the overall load resistances seen by the output stage circuit 200; $R_\pi$ represents the overall input impedance for the output stage circuit 200; and $G_{MOUT}$ represents the overall transconductance for the output stage circuit 200. The $R_\pi$ and $G_{MOUT}$ may vary depending on which output transistors 204, 206, 208 are driving the output signal Vout and whether the auxiliary buffer circuit 202 is in use. When the output signal Vout corresponds to a positive half cycle, then $R_\pi$ and $G_{MOUT}$ are based on output transistors 204 and 206 and auxiliary buffer circuit 202. When the output signal Vout corresponds to a negative half cycle, then then $R_\pi$ and $G_{MOUT}$ are based on output transistors 208. Equation 2 may also be rewritten as shown below in equation 3.

$$V_{OUT}=I_{NTR}*\beta_{OUT}*R_L \quad (3)$$

In equation 3 shown above, $\beta_{OUT}$ represents the overall current-gain for the output stage circuit 200, where $\beta_{OUT}$ equals $R_\pi*G_{MOUT}$ shown in equation 2. Based on equation 3, in large signal operations, the nonlinearity of the output stage circuit 200 originates from the non-linearity of its $\beta_{OUT}$ value.

The auxiliary buffer circuit 202 is able to adjust the output stage circuit's 200 $\beta_{OUT}$ value to reduce the non-linearity behavior. The auxiliary buffer circuit 202 shown in FIG. 2 represents an example embodiment of the auxiliary buffer circuit 114 shown in FIG. 1. Recall that the auxiliary buffer circuit 202 is able to equalize non-linear distortions (e.g., even-order non-linear distortions) caused from the output signal Vout having unsymmetrical positive and negative half cycles. In FIG. 2, the overall β value for output transistors 204 and 206 (without equalization from the auxiliary buffer circuit 202) is relatively lower than the overall β value for output transistors 208. Using FIG. 2 as an example, when utilizing a BiCMOS fabrication process and a nominal process corner, the overall β value without equalization for output transistors 204 and 206 could be about 130, and the overall β value for transistors 208 could be about 170. Since the output transistors 204 and 206 have the lower overall β value, the output transistors 204 and 206 are split into two groups, one group that is directly driven by the current from the previous stage, $I_{NTR}$ (output transistors 206) and another group that is directly driven by the auxiliary buffer circuit 202 (output transistors 204). Having the output transistors 204 directly driven by the auxiliary buffer circuit 202 rather than being direct driven by the current from the previous stage, $I_{NTR}$ equalizes the overall β value associated with the positive half cycle to about 170, and thus is closer to matching the overall β value associated with the negative half cycle.

In FIG. 2, six output transistors 206 and eight output transistors 208 are directly driven by the current from the previous stage, $I_{NTR}$, and two output transistors 204 are driven directly by the auxiliary buffer circuit 202. By directly driving the two output transistors 204 with the auxiliary buffer circuit 202, the overall input impedance for the output transistors 204 and 206 drops to a ratio of about ⅝ of the input impedance without that auxiliary buffer circuit 202. Based on the drop of the input impedance, the overall β value for output transistors 204 and 206 becomes a ratio of ⅝ times larger when compared to the overall β value without the auxiliary buffer circuit 202. Equation 4 presented below quantifies this relationship to determine the number of output transistors 204 should be driven by the auxiliary buffer circuit 202 for FIG. 2.

$$(m+a)/m*\beta_{PNP}=\beta_{NPN} \quad (4)$$

In equation 4, variable "m" represents the number of output transistors 206 driven directly by the current from the previous stage, $I_{NTR}$; variable "a" represents the number of output transistors 204 driven directly by the auxiliary buffer circuit 202; $\beta_{PNP}$ represents the overall β value for the output transistors 204 and 206 without that auxiliary buffer circuit 202; and $\beta_{NPN}$ represents the overall β value for the output transistors 208. "(m+a)/m" represents the equalization ratio when considering the auxiliary buffer circuit 202. Based on the output stage circuit's 200 layout $\beta_{PNP}$ is the overall β value associated with the positive half cycle of the output signal Vout, and $\beta_{NPN}$ is the overall β value associated with the negative half cycle of the output signal Vout.

Figure 3:
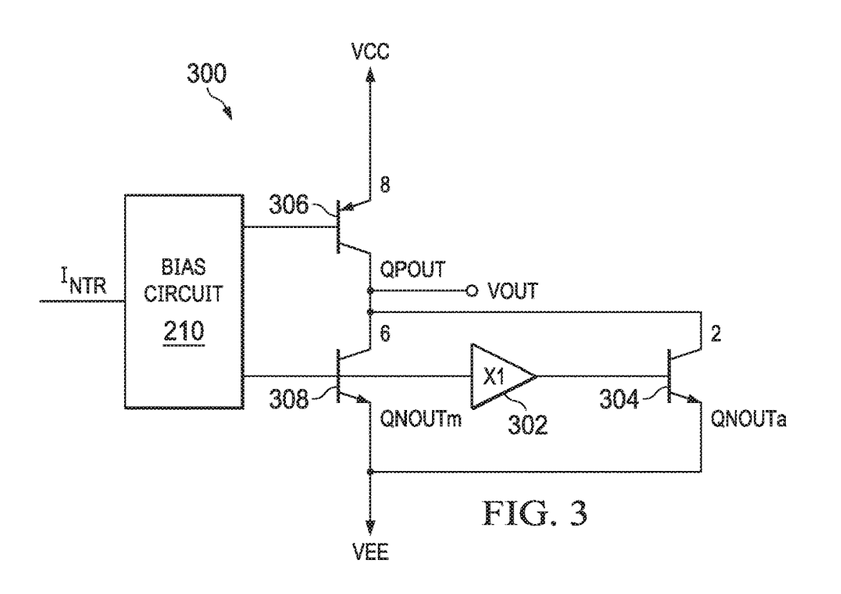
FIG. 3 is a schematic diagram of an embodiment of an output stage circuit that includes an auxiliary buffer circuit to drive the negative half cycle of output signal Vout.

FIG. 3 is a schematic diagram of an embodiment of an output stage circuit 300 that includes an auxiliary buffer circuit 302 to drive the negative half cycle of output signal Vout. In contrast to FIG. 2, the overall β value for the negative half cycle of the output signal Vout is less than the overall β value for the positive half cycle of the output signal Vout. Specifically, the output transistors 304 and 308 (without equalization from the auxiliary buffer circuit 302) is relatively lower than the overall β value for output transistors 306. Because of the overall lower β value, the auxiliary buffer circuit 302 is connected between the bias circuit 210 and output transistors 304 to directly drive the output transistors 304. In other words, the base nodes of output transistors 304 are not directly driven by the current from the previous stage, $I_{NTR}$. Revising equation 4 as previously shown, produces equation 5, which determines and designates the number of output transistors 304 that can be directly driven by the auxiliary buffer circuit 302 to equalize the overall β values.

$$(m+a)/m*\beta_{NPN}=\beta_{PNP} \quad (5)$$

Similar to equation 4, in equation 5, variable "m" represents the number of output transistors 308 driven directly by the current from the previous stage, $I_{NTR}$; variable "a" represents the number of output transistors 304 driven directly by the auxiliary buffer circuit 302; $\beta_{PNP}$ represents the overall β value for the output transistors 306; and $\beta_{NPN}$ represents the overall β value for the output transistors 304 and 308 without that auxiliary buffer circuit 302.

Although FIGS. 2 and 3 illustrates that PNP bipolar output transistors drive the positive half cycle of the output signal Vout and NPN bipolar output transistors drive the negative half cycle of the output signal Vout, other embodiments of output stage circuits 200 and 300 could be reconfigured to use another arrangement of transistors to implement a class AB output stage circuit. For instance, rather than utilizing PNP transistors to drive the positive half cycle of the output signal Vout, the output stage circuits 200 and 300 may use NPN transistors. Additionally, the NPN bipolar transistors that drive the negative half cycle of the output signal Vout could be replaced with PNP transistors. In these embodiments, the previous stage (e.g., intermediate stage) may also differ to provide inputs (e.g., current and/or voltage) to the appropriately drive the output stage circuits 200 and 300.

Figure 4:
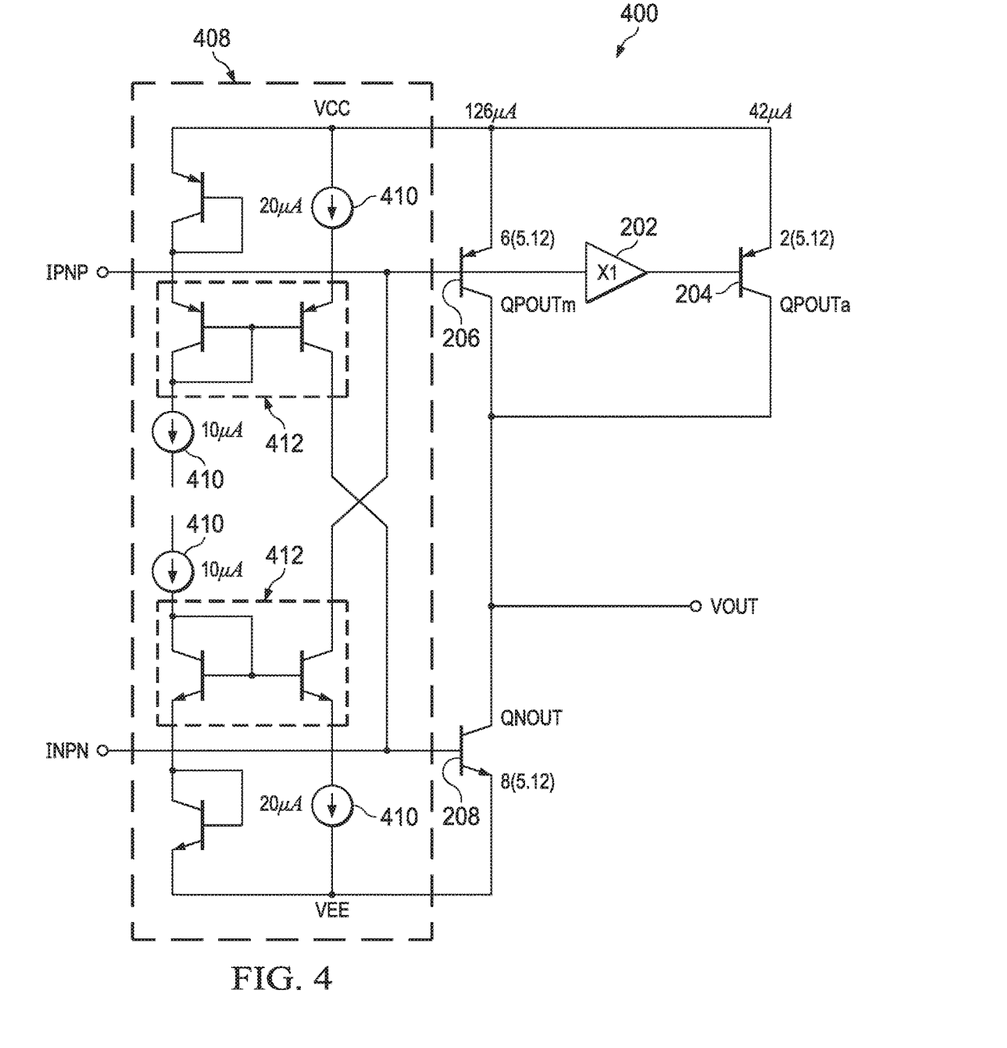
FIG. 4 is a schematic diagram of another embodiment of an output stage circuit 400 that includes an auxiliary buffer circuit and bias circuit.

FIG. 4 is a schematic diagram of another embodiment of an output stage circuit 400 that includes an auxiliary buffer circuit 202 and bias circuit 408. The output stage circuit 400 is similar to the output stage circuit 200 except that the output stage circuit provides a specific embodiment of a bias circuit 408. The bias circuit 408 is used to bias the current and/or voltage at the base nodes of the output transistors 206 and 208 to reduce crossover distortion. In particular, the bias circuit 210 includes constant-current sources 410 and current mirror circuits 412 configured to achieve the desired quiescent bias current. Other embodiments of the output stage circuit 400 could utilize other bias circuit 408 designs and/or include other transistors types, such as field-effect transistors (FET). For example, in addition to using bipolar junction transistors, the output stage circuit 400 may include enhanced n-channel metal-oxide semiconductor field-effect (NMOS) and/or p-channel metal-oxide semiconductor field-effect (PMOS) transistors to implement portions of the bias circuit 408 and/or other portions of the output stage circuit 400.

Similar to FIG. 2, the output stage circuit 400 includes an auxiliary buffer circuit 202 that represents a specific embodiment of the auxiliary buffer circuit 114 shown in FIG. 1. Recall that the auxiliary buffer circuit 114 equalize non-linear distortions (e.g., even-order non-linear distortions) caused from the output signal Vout having unsymmetrical positive and negative half cycles. The auxiliary buffer circuit 202 equalizes the overall β value for the set of output transistors 204 and 206 that drive the positive half cycle of the output voltage Vout with the overall beta value for the set of output transistors 208 that drive the negative half cycle of the output voltage. The $I_{NTR}$ current shown in FIGS. 2 and 3 is divided into currents $I_{PNP}$ and $I_{NPN}$ in FIG. 4. $I_{PNP}$ is provided to the bias circuit 408, output transistors 206, and auxiliary buffer circuit 202 to drive the positive half cycle of the output voltage Vout. $I_{NPN}$ is provided to the bias circuit 408 and output transistors 208 to drive the negative half cycle of the output voltage. Based on the received $I_{PNP}$, auxiliary buffer circuit 202 directly drives the pre-determined number of output transistors 204 to generate QPOUTa while the remaining output transistors 206 are directly driven by the current from the previous stage $I_{PNP}$ to generate QPOUTm. By doing so, the auxiliary buffer circuit 202 centers the variation such that the overall β value for the output transistors 204 and 206 that drive the positive half cycle closely matches the overall β value of the output transistors 208 that drive the negative half cycle of the output signal Vout.

Figure 5:
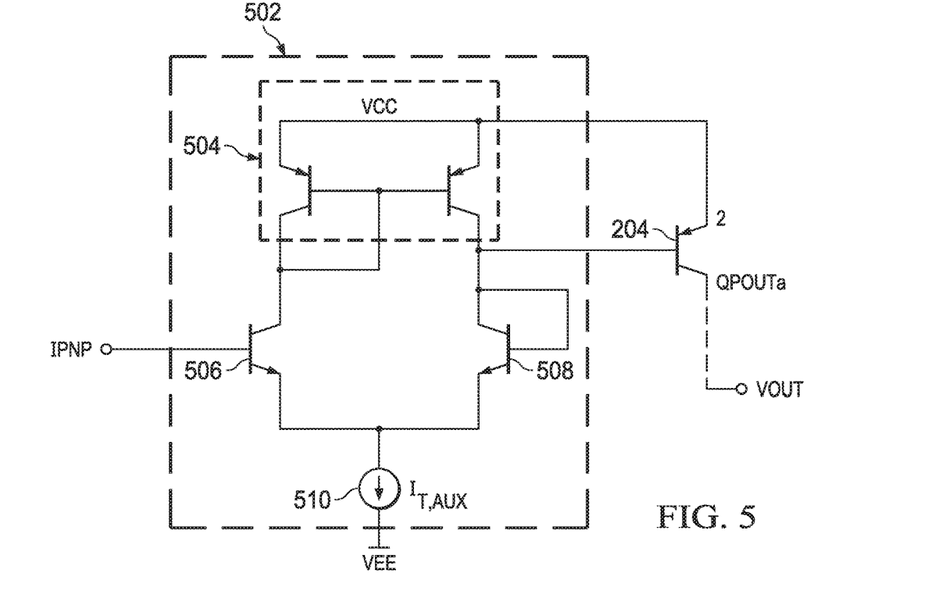
FIG. 5 is a schematic diagram of an embodiment of an auxiliary buffer circuit.

FIG. 5 is a schematic diagram of an embodiment of an auxiliary buffer circuit 502. With reference to FIGS. 2 and 4, the auxiliary buffer circuit 502 may be the auxiliary buffer circuits 202 that drive the output transistors 204. The auxiliary buffer circuit 502 represents a five pack differential to single-ended stage amplifier that self-compensates and consumes a relatively small amount of current when compared to the electronic device. Using FIG. 1 as an example, the electronic device 100 may be a lower power operational amplifier that consumes 600 micro Amperes (μA) when at full power. The auxiliary buffer circuit 502 would have a quiescent power consumption of about 10 μA, which is relatively small compared to the total power consumption of electronic device 100. Incorporating the auxiliary buffer circuit 502, thus, allows for equalization of the overall β value for the output transistors without significantly increasing power consumption.

FIG. 5 depicts that the auxiliary buffer circuit 502 contains a current-mirror circuit 504 and transistors 506 and 508. At the base node of transistor 506, it receives current from the previous stage $I_{PNP}$ (e.g., the intermediate stage circuit 106 using FIG. 1 as an example) and the base node of transistor 508 is connected to its collector node. Based on this configuration, the tail current source $I_{T,AUX}$ 510 is biased by the previous stage $I_{PNP}$ such that the value of the tail current source $I_{T,AUX}$ 510 increases whenever QPOUTa is sourcing a large current. With this feature, the auxiliary buffer circuit 502 implements a pseudo class AB behavior. Additionally, the auxiliary buffer circuit 502 is able to be self-compensating and may not utilize extra compensation because the auxiliary buffer circuit 502 is a single stage amplifier. Other embodiments of the auxiliary buffer circuit 502 could be implemented using a multi-stage amplifier that generates a relatively low current.

Figure 6:
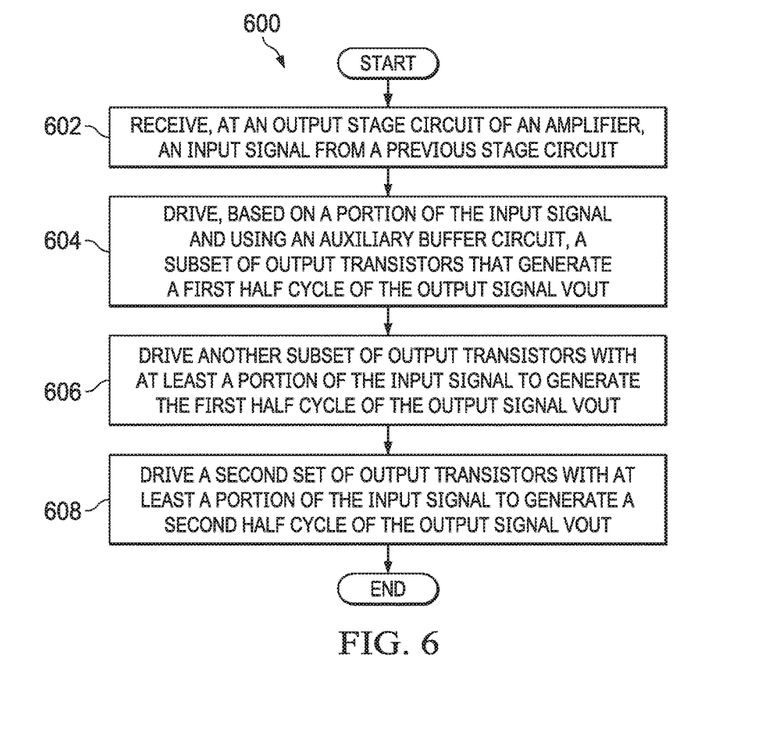
FIG. 6 is a flow chart of an embodiment of a method to equalize non-linear distortions in an electronic device that generates an amplified output signal from one or more input signals.

FIG. 6 is a flow chart of an embodiment of a method 600 to equalize non-linear distortions in an electronic device that generates an amplified output signal from one or more input signals. Using FIGS. 1 and 2 as examples, method 600 can be implemented using the electronic device 100 and the output stage circuit 200, respectively. In one or more embodiments, method 600 is specifically implemented by utilizing an auxiliary buffer circuit 202 within the output stage circuit 200 shown in FIG. 2. Although FIG. 6 illustrates that the blocks of method 600 are implemented in a sequential operation, method 600 is not limited to this order of operations, and instead other embodiments of method 600 may have one or more blocks implemented in parallel operations. For example, blocks 604 and 606 can be implemented sequentially or in parallel.

Method 600 starts at block 602 and receives, at an output stage circuit of an amplifier, an input signal from a previous stage circuit. The input signal may be a voltage and/or current input from the previous stage circuit, such as the intermediate stage circuit 106 shown in FIG. 1. Using FIGS. 2 and 3 as an example, the input signal could corresponds to the current $I_{NTR}$ that is sent from the previous stage circuit. Method 600 then moves to block 604 and drives, based on a portion of the input signal and using an auxiliary buffer circuit, the output transistors that generate a first half cycle of the output signal Vout. In one embodiment, the portion of the input signal could correspond to the input current $I_{PNP}$ shown in FIG. 4. The $I_{PNP}$ biases the auxiliary buffer circuit 202 such that when the output transistors connected to the auxiliary buffer circuit are source relatively large current based on the $I_{PNP}$ current. Method 600 may set the number of output transistors within the subset of output transistors based on previously shown equations 4 and 5. Recall that $I_{PNP}$ may also be provided to a bias circuit to form a class AB output stage circuit.

Method 600 continues to block 606 to drive another subset of output transistors with at least a portion of the input signal to generate the first half cycle of the output signal Vout. Using FIG. 4 as an example, the current $I_{PNP}$ directly drives the second subset of output transistors labeled as output transistors 206 to generate the positive half cycle of the output signal Vout while method 600 drives the output transistors 206 in block 604. In FIG. 4, the desired quiescent current QPOUT pushed out is a combination of the current (labeled as QPOUTa and QPOUTm in FIG. 4) generated from the different subsets of output transistors. Method 600 then moves to block 608 and drives a second set of output transistors with at least a portion of the input current to generate a second half cycle of the output signal Vout. Again, pursuant to using FIG. 4 as an example, the desired quiescent current that is pulled out is labeled QNOUT. The method uses the auxiliary buffer circuit to equalize the β value associated with QPOUT and QNOUT to avoid even-ordered distortions.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). The use of the term "about" means±10% of the subsequent number, unless otherwise stated.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise.

What is claimed is:

1. An output stage circuit of an amplifier comprising:
    a first set of output transistors configured to couple to a load of the amplifier and produce a portion of an output signal Vout of the output stage circuit;
    a second set of output transistors configured to couple the load of the amplifier and produce another portion of the output signal Vout;
    an auxiliary buffer circuit directly connected to base nodes of a first subset of the first set of output transistors; and
    a bias circuit coupled to base nodes of a second subset of the first set of output transistors, base nodes of the second set of output transistors, and the auxiliary buffer circuit,
    wherein the base nodes of second subset and the base nodes of the second set of output transistors are coupled to one or more input terminals that provide an input signal from a previous stage circuit of the output stage circuit.

2. The output stage circuit of claim 1, the auxiliary buffer circuit is configured to equalize an overall current gain for the first set of output transistors without the auxiliary buffer circuit and an overall current gain for the second set of output transistors.

3. The output stage circuit of claim 1, wherein the output stage circuit is a class AB output stage circuit based on the bias circuit.

4. The output stage circuit of claim 1, wherein the auxiliary buffer circuit is a single stage amplifier configured to increase an overall current gain for the first set of output transistors.

5. The output stage circuit of claim 1, wherein the first set of output transistors are coupled to the second set of output transistors such that the first set of output transistors drive a positive half cycle of the output signal Vout.

6. The output stage circuit of claim 1, wherein the second set of output transistors are coupled to the first set of output transistors such that the second set of output transistors drive a negative half cycle of the output signal Vout.

7. The output stage circuit of claim 1, wherein a number of output transistors allocated to the first subset is based on a number of output transistors allocated to be directly driven by the input signal from the previous stage circuit, an overall current gain for the first set of output transistors without the auxiliary buffer circuit, and an overall current gain for the second set of output transistors.

8. The output stage circuit of claim 7, wherein the overall current gain for the first set of output transistors without the auxiliary buffer circuit increases based on a ratio of a total number of output transistors within the first set of output transistors and the number of output transistors allocated to the first subset.

9. The output stage circuit of claim 1, wherein the auxiliary buffer circuit is configured to reduce an overall impedance of the first set of output transistors based on a number of output transistors allocated to the first subset and a number of output transistors allocated to the second subset.

10. The output stage circuit of claim 9, the auxiliary buffer circuit is configured to reduce the overall impedance of the first set of output transistors based on a ratio of the number of output transistors allocated to the first subset and a total number of output transistors within the first set of output transistors.

11. An output stage circuit of an amplifier comprising:
    a first set of output transistors configured to couple to a load of the amplifier and produce a portion of an output signal Vout of the output stage circuit;
    a second set of output transistors configured to couple the load of the amplifier and produce another portion of the output signal Vout; and
    an auxiliary buffer circuit directly connected to a first subset of the first set of output transistors,
    wherein the auxiliary buffer circuit is configured to drive base nodes for the first subset the first set of output transistors to equalize a current gain of the first set of output transistors with a current gain of the second set of output transistors, and
    wherein a second subset of the first set of output transistors are driven by an input signal from a previous stage circuit of the output stage circuit.

12. The output stage circuit of claim 11, wherein the auxiliary buffer circuit is a single stage amplifier that drives the first subset of the first set of output transistors to generate a positive half cycle of the output signal Vout.

13. The output stage circuit of claim 11, further comprising a bias circuit that configures the output stage circuit to be a class AB output stage circuit.

14. The output stage circuit of claim 11, wherein a number of output transistors allocated to the first subset is based on a number of output transistors allocated to be directly driven by the input signal from the previous stage circuit, an overall current gain for the first set of output transistors without the auxiliary buffer circuit, and an overall current gain for the second set of output transistors.

15. The output stage circuit of claim 14, wherein the overall current gain for the first set of output transistors without the auxiliary buffer circuit increases based on a ratio of a total number of output transistors within the first set of output transistors and the number of output transistors allocated to the first subset.

16. The output stage circuit of claim 11, wherein the auxiliary buffer circuit is configured to reduce an overall impedance of the first set of output transistors based on a number of output transistors allocated to the first subset and a number of output transistors allocated to the second subset.

17. A method comprising:
receiving, at an output stage circuit of an amplifier, an input signal from a previous stage circuit of the amplifier;
driving a first subset of output transistors within the output stage circuit with an auxiliary buffer circuit that receives the input signal to generate a first half cycle of an output signal Vout;
driving a second subset of output transistors within the output stage circuit with the input signal to generate the first half cycle of the output signal Vout; and
driving a set of output transistors with the input signal to generate a second half cycle of the output signal Vout,
wherein the auxiliary buffer circuit equalizes an overall current gain associated with the first and second subset of output transistors with an overall current gain associated with the set of output transistors.

18. The method of claim 17, wherein a number of output transistors allocated to the first subset of output transistors is based on a number of output transistors allocated to be directly driven by the input signal from the previous stage circuit, an overall current gain associated with the first and the second subset of output transistors, and an overall current gain for the set of output transistors.

19. The method of claim 18, wherein the overall current gain associated with the first and the second subset of output transistors increases based on a ratio of a total number of output transistors for the first and the second subset of output transistors and the number of output transistors allocated to the first subset of output transistors.

20. The method of claim 17, further comprising biasing base nodes of the second subset of output transistors and the set of output transistors to produce a class AB output stage circuit.

* * * * *